United States Patent [19]
Clark

[11] 3,746,946
[45] July 17, 1973

[54] INSULATED GATE FIELD-EFFECT TRANSISTOR INPUT PROTECTION CIRCUIT

[75] Inventor: Lowell E. Clark, Scottsdale, Ariz.

[73] Assignee: Motorola, Inc., Franklin Park, Ill.

[22] Filed: Oct. 2, 1972

[21] Appl. No.: 293,959

[52] U.S. Cl. .................. 317/235, 307/202, 307/251, 307/279
[51] Int. Cl. .... H01l 11/00, H02h 7/20, H03k 17/60
[58] Field of Search .................... 307/251, 304, 279, 307/202; 317/235 B

[56] References Cited

UNITED STATES PATENTS

| | | | |
|---|---|---|---|
| 3,229,218 | 1/1966 | Sickles et al. | 330/29 |
| 3,588,525 | 6/1971 | Hatsukano et al. | 307/202 |

*Primary Examiner*—John W. Huckert
*Assistant Examiner*—Joseph E. Clawson, Jr.
*Attorney*—Vincent J. Rauner and Thomas G. Devine

[57] ABSTRACT

A circuit for protecting an insulated gate field-effect transistor (IGFET) circuit from damage caused by spurious, high voltage inputs resulting primarily from static charge is made up of a pair of IGFET's. A first protection circuit IGFET has a drain connected to the gate of at least one main circuit IGFET to be protected, the gate of the main circuit IGFET being connected to an input terminal. The source of the first protection circuit IGFET is connected to a common reference. The gate of the first protection circuit IGFET is connected to the drain of a second protection circuit IGFET whose source is connected to the common reference and whose gate is connected to a discharge terminal for applying a voltage to the gate sufficient to turn on the second protection circuit IGFET. The first protection circuit IGFET goes into an avalanche condition when a spurious signal of a polarity to cause a reverse bias is of sufficient amplitude to start an injection of carriers from the drain to the gate. The avalanche condition is maintained until the drain voltage drops below the avalanche maintenance value. The charge on the gate of the first protection circuit IGFET may or may not leak off by the time the circuit is ready for testing. Whether the charge has leaked off or not is of no consequence because when the circuit is connected to the tester, a voltage is applied to the gate of the second protection circuit IGFET turning it on and causing the charge on the gate, if any, of the first protection circuit IGFET to be conducted to ground.

6 Claims, 2 Drawing Figures

INSULATED GATE FIELD-EFFECT TRANSISTOR INPUT PROTECTION CIRCUIT

BACKGROUND OF THE INVENTION

1. Field of the Invention

This invention relates to protection of electronic circuits from damage caused by spurious input voltages. Specifically, it relates to a protection scheme for protecting IGFET circuits from having the insulation between the gate and substrate damaged by the spurious voltage. The spurious voltage is bypassed before it reaches the gate of the IGFET to be protected and thereby causes no damage. The IGFET circuits to be protected may be made up of one channel type or may be made of complementary channel types such as CMOS or silicon gate CMOS.

2. Description of the Prior Art

In a typical IGFET circuit, the input is applied to the gate of one or more IGFET's. The insulating layer between the gate and the substrate of the IGFET is made very thin so that the gate of the IGFET may be used effectively to create a field in the substrate. The input circuit is a very high impedance circuit with no inherent shunt paths. With the thin insulating gate layer, a large, transient voltage may drive through the input circuit to the gate and through the insulating layer, causing an open circuit, or more often, it is believed, a short circuit.

The unwanted voltage input comes about through handling in the manufacturing process. Static charges are built up through the use of soldering irons, machinery and particularly through handling by persons. The static charge may be of very large voltage amplitude, thus easily damaging the insulating layer beneath the gate of the IGFET to which the input is connected. The circumstances causing such static charges are most difficult to eliminate and therefore there has been a continuing effort to protect the IGFET circuit against those spurious signals which most certainly occur.

Probably the first effort at circuit protection was simply connecting a diode between the input and the substrate upon which the IGFET is formed. The diode is connected so that when a spurious signal occurs at the input, it is immediately conducted to the substrate when the diode is forward biased. When the incoming spurious signal is of a polarity to reverse bias the diode, it is necessary that the diode go into a reverse current condition at some potential lower than the potential necessary to damage the insulating layer under the gate of the main circuit IGFET. This type of protection circuit has proved unsatisfactory because of the observable diode characteristic of its reverse breakdown characteristic increasing after each successive breakdown conduction. That is, after a period of time, the reverse breakdown voltage of the diode may well be higher than that of the IGFET critical voltage.

This diode protection scheme has been carefully studied in the prior art and has resulted in back-to-back diode arrangements and in the developement of field plate diodes which are diodes designed to have a lower reverse breakdown voltage characteristic.

A widely used scheme is that of connecting another IGFET to the input circuit. The drain is connected to the input, the source is connected to ground and the gate is connected to the drain. This circuit is a diode-connected IGFET that requires a particularly large channel compared with that of the IGFET to be protected for the protection IGFET to be effective. The size requirement is a distinct disadvantage.

Still another circuit arrangement has been to connect the drain of a protection circuit IGFET to the input circuit, its source to ground and its gate through a resistor to ground. The protection circuit IGFET goes into an avalanche mode when the spurious input signal causes a reverse bias situation. The resistor drops a very large part of the spurious input voltage, protecting the insulation material under the gate of the protection IGFET. The physical size of the resistor and the manufacturing difficulty in consistently reproducing the ohmic value are disadvantages in this circuit.

BRIEF SUMMARY OF THE INVENTION

In the preferred embodiment, the particular circuit configuration is the well-known metal-oxide-silicon (MOS) device. The circuitry also may be complementary MOS (CMOS) or silicon gate CMOS. The drain of the first protection circuit MOS device is attached to the input terminal which in turn is connected to the gate of the main circuit MOS device to be protected. The source of the first protection circuit MOS device is connected to ground. A second protection circuit MOS device has its drain connected to the gate of the first protection circuit MOS device and its source connected to ground. Its gate is connected to a discharge terminal for application of a potential of sufficient amplitude to turn on the second protection circuit MOS device.

In operation, the first protection circuit MOS device goes into an avalanche mode when reverse biased by a spurious, high voltage input signal. Carriers are injected into the gate charging the gate and causing the first protection circuit MOS device to become conductive, thus causing current to flow to ground through the source. This current is in addition to the avalanche current flowing into the substrate. When the spurious voltage on the drain of the first protection circuit MOS device goes below the value for maintaining the avalanche, the avalanche stops but the charge remains on the gate of the first protection circuit MOS device. It may leak off through the drain-to-substrate junction of the second protection circuit MOS device. However, if the gate of the first protection circuit MOS device remains charged when the circuit is to be tested, it will be discharged when hooked to the tester. The tester will supply a voltage on the discharge terminal to the gate of the second protection circuit MOS device causing it to conduct, thereby conducting any charge from the gate of the first protection circuit MOS device to ground. This positively turns off the first protection circuit MOS device so that the input to the main circuit MOS device is normal. When the spurious signal is of the opposite polarity, the first protection circuit MOS device is forward biased and the spurious signal thereby immediately shunted into the substrate.

DETAILED DESCRIPTION OF THE INVENTION

Figure 1:
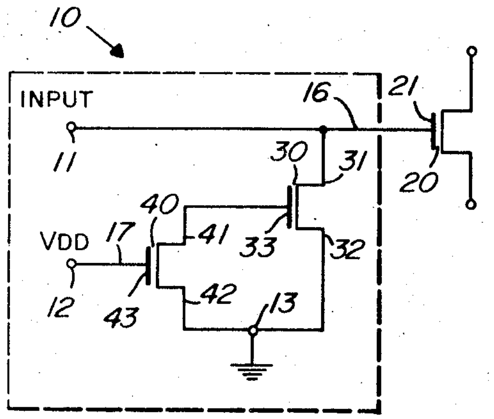
FIG. 1 is a schematic diagram illustrating the main circuit MOS device and the protection circuit.

FIG. 1 illustrates a circuit 10 having a main circuit MOS device 20 whose gate 21 is connected to input terminal 11. A plurality of MOS or CMOS devices could, of course, be tied to input terminal 11. First protection circuit MOS device 30 and second protection circuit MOS device 40 are of the same channel conductivity type. The drain 31 of first protection circuit MOS device 30 is connected to input 11 and has its source 32 connected to common terminal 13. Second protection circuit MOS device 40 has its source 41 connected to the gate 33 of first protection circuit MOS device 30 and has its source 42 connected to common terminal 13. The gate 43 is connected to discharge terminal 12. The protection circuit could utilize CMOS devices. For example, the first protection circuit device could be of the P-channel type and the second protection circuit device could be of the N-channel type with its source connected to the discharge terminal 12, its gate connected to ground and its drain connected to the gate 33 of device 30.

In the preferred embodiment, the MOS devices are of the P-channel conductivity type. They could, of course, be of the N variety type. Also, when reference is made to the drain and source, those skilled in the art realize that the terminology is one of convenience, that the drain and source are interchangeable elements of MOS devices and IGFET's in general. The particular embodiment selected for this application utilizes a physically common source electrode because of the particular application as is evident in FIG. 2.

Figure 2:
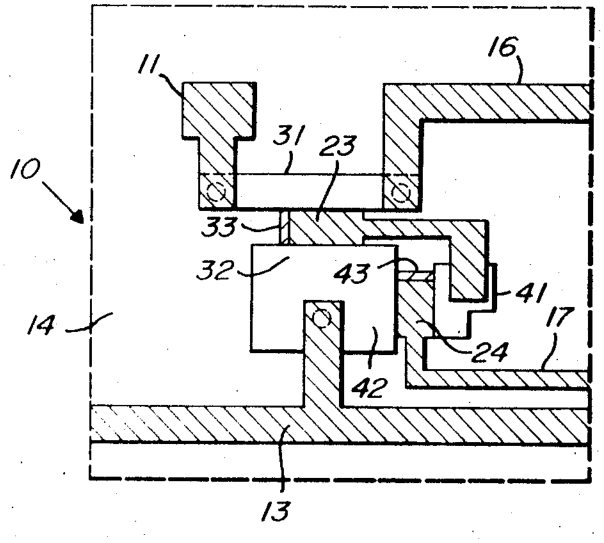
FIG. 2 is a plan view of a substrate embodying the schematic diagram of the protection circuit of FIG. 1.

Substrate 14 is shown in FIG. 2 with the protection circuit 10 in a plan view. Gates 33 and 43 are indicated underlying metalization 23 and 24 respectively. Sources 32 and 42 are shown as one common diffusion connected to common terminal 13. Conductor 16 is partially shown and, as indicated in FIG. 1, is connected to the circuit to be protected. Conductor 17 is connected to the discharge terminal 12 as shown in FIG. 1.

The MOS circuit shown in FIG. 2 also could be comprised of silicon gate type devices. The plan would require alteration from FIG. 2, but those with ordinary skill in the art are readily able to make the required changes.

MODE OF OPERATION

When a large amplitude spurious voltage signal is introduced at input terminal 11, it is also introduced at drain 31 of first protection circuit MOS device 30. If the spurious signal is of a polarity to reverse bias MOS device 30, carriers are injected from drain 31 into gate 33. If the spurious signal is of the other polarity, then there is a forward biasing and the spurious signal is conducted to the substrate 14. In the reverse bias situation, the introduction of carriers from drain 31 to gate 33 causes MOS device 30 to go into an avalanche mode. Gate 33 becomes charged up, turning on device 30. Therefore current is conducted by way of the avalanche mode to the substrate and also from the drain 31 through the source 32 to ground. When the spurious voltage signal at drain 31 drops below that required to maintain the avalanche, the avalanche stops but the charge on gate 33 remains. There may be leakage of the charge through the diode formed by drain 41 and the substrate 14.

To insure that there is no charge left on the gate 33, a voltage is impressed on the discharge terminal 12 when the circuit is tested. The voltage applied at discharge terminal 12 is sufficient to turn on device 40 thus causing any charge remaining on the gate 33 to be conducted to ground through drain 41 and source 42 of device 40. This shuts off device 30 so that when a test input is applied at input terminal 11, the main circuit will operate properly. That is to say, if device 30 had a charge remaining on its gate 33, it would be conductive and the testing procedure would reveal a short circuit, thus indicating a faulty main circuit. Conversely, when device 30 is turned off, there is no short circuit and the test produces positive results.

I claim:

1. An integrated, input protection circuit, formed upon a substrate, having input means connected to the gate of at least one main circuit insulated gate field-effect transistor to be protected from spurious, high amplitude voltage signals, comprising:

a. a protection circuit insulated gate field-effect transistor having a gate, and having a drain connected to the input means and the source connected to a common terminal for injection of carriers from the drain to the gate in an avalanche mode to charge the gate when a spurious signal of a reverse bias polarity is received;

b. a second protection circuit insulated gate field-effect transistor whose drain is connected to the gate of the first protection circuit insulated gate field-effect transistor, its source is connected to the common terminal and its gate is connected to the discharge terminal, and having a control electrode for selectively causing the second protection circuit insulated gate field-effect transistor to conduct; and c. a discharge terminal connected to the gate of the second protection circuit insulated gate field-effect transistor for applying a potential to the control electrode to cause the second protection circuit insulated gate field-effect transistor to conduct.

2. The circuit of claim 1 wherein the second protection circuit insulated gate field-effect transistor has a channel conductivity type complementary to that of the protection circuit insulated gate field-effect transistor.

3. The circuit of claim 1 wherein the channel conductivity of the first and second protection circuit insulated gate field-effect transistors is the same.

4. The circuit of claim 3 wherein the main circuit and the first and second protection circuit insulated gate field-effect transistors are of the P-channel conductivity type.

5. The circuit of claim 3 wherein the main circuit and first and second protection circuit insulated gate field-effect transistors are of MOS type.

6. The circuit of claim 2 wherein the main circuit and the protection circuit are comprised of CMOS devices.

* * * * *